(12) United States Patent
Suzuki

(10) Patent No.: US 12,100,588 B2
(45) Date of Patent: *Sep. 24, 2024

(54) METHOD OF POST-DEPOSITION TREATMENT FOR SILICON OXIDE FILM

(71) Applicant: ASM IP Holding B.V., Almere (NL)

(72) Inventor: Toshiya Suzuki, Machida (JP)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/214,891

(22) Filed: Jun. 27, 2023

(65) Prior Publication Data

US 2023/0343587 A1 Oct. 26, 2023

Related U.S. Application Data

(63) Continuation of application No. 17/352,330, filed on Jun. 20, 2021, now Pat. No. 11,735,414, which is a continuation of application No. 15/890,037, filed on Feb. 6, 2018, now Pat. No. 11,081,345.

(51) Int. Cl.
| | |
|---|---|
| *H01L 21/02* | (2006.01) |
| *C23C 16/40* | (2006.01) |
| *H01L 21/3105* | (2006.01) |
| *H01L 21/311* | (2006.01) |
| *H10B 69/00* | (2023.01) |
| *C23C 16/56* | (2006.01) |

(52) U.S. Cl.
CPC ........ *H01L 21/0234* (2013.01); *C23C 16/402* (2013.01); *H01L 21/02164* (2013.01); *H01L 21/02219* (2013.01); *H01L 21/02274* (2013.01); *H01L 21/0228* (2013.01); *H01L 21/3105* (2013.01); *H01L 21/31111* (2013.01); *H10B 69/00* (2023.02); *C23C 16/401* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 7,587,028 B1 | 9/2009 | Broerman et al. | |
| 7,589,028 B1 | 9/2009 | Cho et al. | |
| 11,735,414 B2 * | 8/2023 | Suzuki ................. | C23C 16/402 |
| | | | 438/694 |
| 2001/0048981 A1 | 12/2001 | Suzuki | |
| 2002/0086486 A1 | 7/2002 | Tanaka et al. | |
| 2004/0048452 A1 | 3/2004 | Sugawara et al. | |
| 2004/0151845 A1 | 8/2004 | Nguyen et al. | |

(Continued)

FOREIGN PATENT DOCUMENTS

CN 1452778 A 10/2003

*Primary Examiner* — Jiong-Ping Lu
(74) *Attorney, Agent, or Firm* — Snell & Wilmer L.L.P.

(57) ABSTRACT

A method of post-deposition treatment for silicon oxide film includes: providing in a reaction space a substrate having a recess pattern on which a silicon oxide film is deposited; supplying a reforming gas for reforming the silicon oxide film to the reaction space in the absence of a film-forming precursor, said reforming gas being composed primarily of He and/or $H_2$; and irradiating the reforming gas with microwaves in the reaction space having a pressure of 200 Pa or less to generate a direct microwave plasma to which the substrate is exposed, thereby reforming the silicon oxide film.

20 Claims, 12 Drawing Sheets

(56) References Cited

U.S. PATENT DOCUMENTS

2012/0258257 A1  10/2012  Nguyen et al.
2016/0020092 A1   1/2016  Kang et al.
2017/0243734 A1   8/2017  Ishikawa et al.
2018/0005814 A1   1/2018  Kumar et al.

* cited by examiner

METHOD OF POST-DEPOSITION TREATMENT FOR SILICON OXIDE FILM

CROSS-REFERENCE TO RELATED APPLICATIONS

This application is a continuation of, and claims priority to, U.S. patent application Ser. No. 17/352,330 filed Jun. 20, 2021 and titled METHOD OF POST-DEPOSITION TREATMENT FOR SILICON OXIDE FILM (now U.S. Pat. No. 11,735,414); which is a continuation of U.S. application Ser. No. 15/890,037, filed on Feb. 6, 2018 (now U.S. Pat. No. 11,081,345 issued Aug. 3, 2021) and titled METHOD OF POST-DEPOSITION TREATMENT FOR SILICON OXIDE FILM, the disclosures of which are incorporated herein in their entirety by reference.

BACKGROUND OF THE INVENTION

Field of the Invention

The present invention is related generally to post-deposition treatment for silicon oxide film used in a semiconductor fabrication process.

Description of the Related Art

Recently, as miniaturization of Fin-FET structures and 3D technology of memory progress, a demand for high quality, high in-plane uniformity, and high conformality of silicon oxide film used in such processes becomes intense. Particularly, development of 3D V-NAND flash memories is remarkable, and demand for silicon oxide film which is applicable to a trench or hole having a high aspect ratio has increased every year.

Conventionally, when an insulation film such as a gate oxide film, which is required to be high in insulating property and low in current leakage property, is deposited, a silicon oxide film is commonly deposited as such an insulation film by a thermal oxidation method (e.g., JP 2004-336019). However, since a high-temperature treatment process involved in the method causes fusion of a metallic compound having a low melting point or decomposition of a high-molecular compound, it is not preferable to use such a high-temperature treatment process in a fabrication process for devices having complicated structures using such a compound.

As a method for forming a silicon oxide film at a low temperature, it is known to perform a post-deposition reformation process on a silicon oxide film deposited at a low temperature so as to improve the film quality to the extent obtained by the thermal oxidation method. For example, it is known to perform a silicon oxide film deposition process by CVD, followed by a reforming process by a plasma using oxygen, ozone, water, and helium (e.g., JP 08-203893).

As a low-temperature method of deposition of silicon oxide film, plasma-enhanced atomic layer deposition (PEALD) is capable of depositing a remarkably high-quality conformal film at a low temperature, and brings about better results than does CVD. However, when depositing a silicon oxide film by PEALD at a low temperature in a recess having a high aspect ratio (e.g., >10), the quality of a film deposited on a sidewall of the recess is significantly degraded as compared with the quality of a film deposited on a top surface where the recess is formed or on a bottom of the recess. The present inventor recognizes that this is because the amount of ion irradiation is significantly low along the sidewall of the recess, and thus, even when using PEALD to deposit a silicon oxide film, by performing a post-deposition reforming process for reforming the deposited silicon oxide film, as in the conventional method, it is necessary to reform the silicon oxide film deposited particularly on the sidewall. Considering application of a silicon oxide film in semiconductor fabrication processes, the present inventor believes that such a post-deposition treatment process of silicon oxide film should be capable of bringing about a high degree of improvement on the film quality by reformation at a low temperature of 300° C. or less, and should have a fast processing speed so as to reduce treatment duration.

Considering the above, the present inventors completed an invention based on the finding that treatment by high-frequency plasma using, for example, solely helium gas, solely hydrogen gas, or solely a mixture of helium gas and hydrogen gas, in place of or without performing conventional plasma treatment using oxygen gas or gas containing oxygen, brought remarkably improved effects on "reformation" of silicon base material.

Any discussion of problems and solutions in relation to the related art has been included in this disclosure solely for the purposes of providing a context for the present invention, and should not be taken as an admission that any or all of the discussion was known at the time the invention was made.

SUMMARY OF THE INVENTION

In some embodiments, by exposing a silicon oxide film deposited by CVD or ALD to a reforming gas consisting essentially of pure helium gas, pure hydrogen gas, or a mixture of pure helium gas and pure hydrogen gas, the silicon oxide film is reformed from its surface to a depth of 10 nm or deeper. When irradiating the reforming gas with a microwave plasma characterized by high plasma density and low electron temperature, a high degree of film quality improvement can be realized at high throughput. For example, a first embodiment provides a reforming method of silicon oxide film in which by using a reforming gas consisting essentially of pure helium gas, pure hydrogen gas, or a mixture of pure helium gas and pure hydrogen gas as the entire process gas in a reaction space, excited He particles and/or $H_2$ particles having high energy can be utilized for reforming the silicon oxide film in a reforming process while maintaining their energy by avoiding collision with particles of other additive gas. A second embodiment provides a reforming method using treatment conditions at a pressure of 100 Pa or less (preferably 30 Pa or less) for performing the reforming process where active spaces having substantially high energy can readily be generated. A third embodiment provides a reforming method irradiating the reforming gas with a direct microwave plasma which is ignited directly above a substrate so as to obtain a high degree of improvement on the film quality with high in-plane uniformity thereof within even a short duration of the reforming process. A fourth embodiment provides a reforming method performing the reforming process to obtain a high degree of improvement on the film quality even at a low temperature of the substrate which is 300° or less including room temperature.

For example, the first to fourth embodiments can bring about the following significant effects which conventional methods cannot achieve. According to the first embodiment, a high degree of reformation can be obtained in which the resultant reformed silicon oxide film can have a wet etch rate (WERR) of approximately 2.0, for example, as compared with a wet etch rate (WERR) of approximately 9.8, for example, obtained when a silicon oxide film is reformed using oxygen gas which is conventionally used (in this disclosure, the WERR is a wet etch relative rate which is a relative number as measured when the wet etch rate of a thermal oxide film is set at 1 (one) as a reference number). According to the second embodiment, a high degree of reformation can be obtained in which the WERR of a reformed film deposited on sidewalls can be approximately ⅕ of the WERR of a non-reformed film deposited on sidewalls even at a high aspect ratio (e.g., AR ~10). According to the third embodiment, a high degree of reformation can be obtained as compared with the use of conventional RF power as a plasma source. According to the fourth embodiment, a high degree of reformation can be obtained in which the content of hydrogen of the silicon oxide film can significantly be reduced where hydrogen is desorbed and released from the silicon oxide film even without performing annealing treatment of the substrate at 400° C. or higher.

For example, according to any of the above effects singly or in any combination, the following benefits can be realized. Since a high-quality silicon oxide film can be obtained even at a low temperature of 300° C. or less, the problem in fusion of a material having a low melting point used in a semiconductor fabrication process using a silicon oxide film, can be avoided. Accordingly, a silicon oxide film can be formed after a wiring process using a material having a low melting point or the like. Further, this technology can be applied to a situation where high insulation property and film formation property at a low temperature are required as in processes of fabricating organic EL devices. Furthermore, since the reforming gas does not contain oxygen gas, oxidation of any material contained in the substrate can be avoided.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
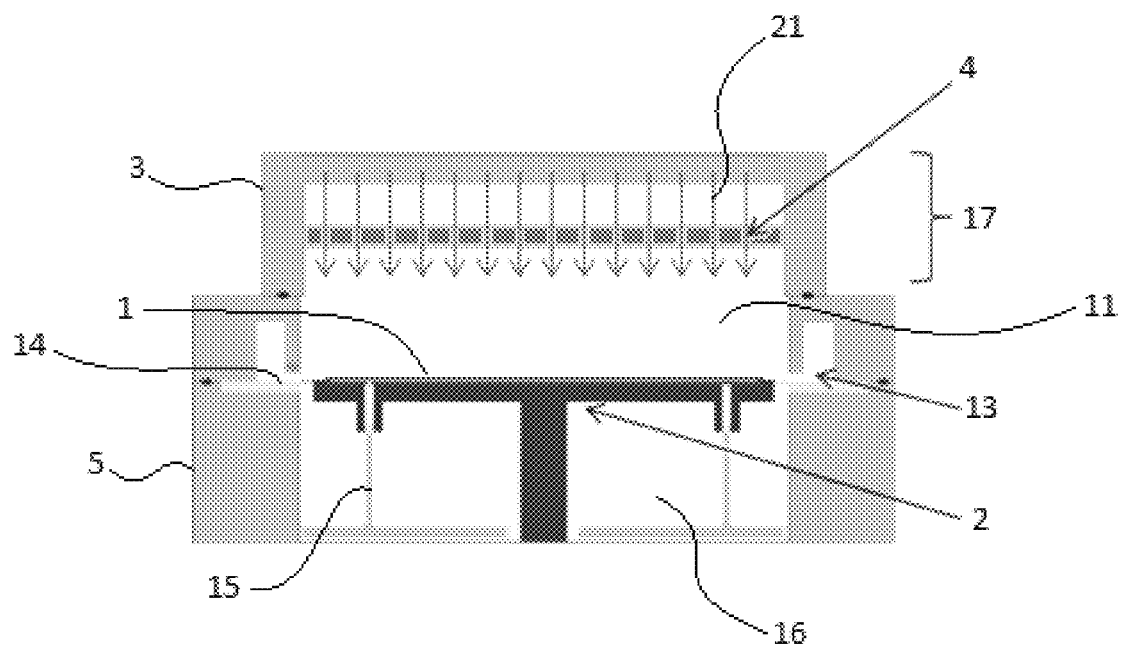
FIG. 1 is a schematic representation of a microwave plasma apparatus for reforming a silicon oxide film usable in an embodiment of the present invention.

In this disclosure, "gas" may include vaporized solid and/or liquid and may be constituted by a single gas or a mixture of gases, depending on the context. Likewise, an article "a" or "an" refers to a species or a genus including multiple species, depending on the context. In this disclosure, a process gas introduced to a reaction chamber through a showerhead may be comprised of, consist essentially of, or consist of a silicon-containing precursor and an additive gas. The additive gas may include a reactant gas for nitriding and/or carbonizing the precursor, and an inert gas (e.g., noble gas) for exciting the precursor, when electromagnetic wave power is applied to the additive gas. The inert gas may be fed to a reaction chamber as a carrier gas and/or a dilution gas. A gas other than the process gas, i.e., a gas introduced without passing through the showerhead, may be used for, e.g., sealing the reaction space, which includes a seal gas such as a noble gas. In some embodiments, the term "precursor" refers generally to a compound that participates in the chemical reaction that produces another compound, and particularly to a compound that constitutes a film matrix or a main skeleton of a film, whereas the term "reactant" refers to a compound, other than precursors, that activates a precursor, modifies a precursor, or catalyzes a reaction of a precursor, wherein the reactant may provide an element (such as N, C) to a film matrix and become a part of the film matrix, when RF power is applied. The term "inert gas" refers to a gas that generates a plasma when electromagnetic wave power is applied, but unlike a reactant, it does not become a part of a film matrix.

In the reforming step or post-deposition treatment step, a reforming gas is used. The "reforming gas" refers to a gas used for post-deposition treatment or introduced to the reaction space during post-deposition treatment, and typically includes no precursor nor reactant gas, nor other additive gas used for deposition. The reforming gas may include a seal gas, other inert gas, or other additive gas. When the reforming gas is constituted by multiple gases, it can be introduced as a mixed gas or separately to a reaction space. The reforming gas can be introduced to the reaction space through a shower plate or other gas inflow port which is capable of feeding the gas uniformly to the reaction space or uniformly around an antenna for generating a direct microwave plasma installed in the reaction space. The reforming gas may be introduced to the reaction space upstream of the antenna or to a surface of the antenna facing the susceptor.

In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

The embodiments will be explained with respect to preferred embodiments. However, the present invention is not limited to the preferred embodiments.

In some embodiments, a method of post-deposition treatment for silicon oxide film, comprises: (i) providing in a reaction space a substrate on which a silicon oxide film is deposited; (ii) supplying a reforming gas for reforming the silicon oxide film to the reaction space in the absence of a film-forming precursor, said reforming gas being composed primarily of He and/or $H_2$; and (iii) irradiating the reforming gas with microwaves in the reaction space having a pressure of 200 Pa or less (preferably 1 Pa to 30 Pa) to generate a direct microwave plasma to which the substrate is exposed, thereby reforming the silicon oxide film.

In some embodiments, the substrate has a recess pattern, wherein even if the silicon oxide film has inferior quality at sidewalls of recesses as compared with the quality on a top surface in which the recess pattern is formed and the quality at bottoms of the recesses, by reforming the film by the direct microwave plasma using the reforming gas, the film can have geographically or topologically substantially uniform or homogeneous quality (e.g., a variation of the etched quantity in a preset duration of wet etching or per unit of time depending on the geographical or topological locations, e.g., top surface, sidewall, and bottom, may be ±30% or less, typically ±20% or less with reference to the average etched quantity at the locations). In some embodiments, the recess pattern is constituted by any recesses including trenches and holes, each having a width of 10 nm to 60 nm, a depth of 30 nm to 300 nm, and an aspect ratio of 3 to 10. In some embodiments, the reforming step is conducted during a process of forming a 3D NAND flash memory.

In some embodiments, the microwaves have a frequency of 800 MHz to 10 GHz. Since microwaves have a significantly higher frequency than an RF frequency (typically 13.56 MHz), a plasma having a high density can be generated using microwaves. For example, a cut-off frequency (f [Hz]) can be calculated as $f \approx 9 \cdot \sqrt{(n_e)}$ wherein $n_e$ is a plasma density [/m$^3$]. If the cut-off frequency is 13.56 MHz, the plasma density is approximately $2 \times 10^{12}$/m$^3$, whereas if the cut-off frequency is 2.45 GHz, the plasma density is approximately $4 \times 10^{16}$/m$^3$, indicating that electric power can be supplied to a plasma until the plasma density reaches a significantly higher level when using microwaves than when using RF waves, i.e., microwaves are more effective than RF waves as a plasma source. Further, electron temperature obtained when using microwaves is higher than that obtained when using RF waves. Additionally, ions follow RF waves and swing, whereas ions do not follow microwaves and thus do not swing. The excited state of atoms and molecules by microwaves is different from that by RF waves.

The plasma density is also referred to as "electron density" or "ion saturation current density" and refers to the number of free electrons per unit volume. The plasma density in the reaction space can be measured using a Langmuir probe (e.g., LMP series).

The "direct microwave plasma" is a plasma excited by microwaves in a reaction space where a gas is directly irradiated with microwaves above a substrate on a susceptor. The direct microwave plasma includes a surface wave plasma and contains both radicals and ions, as compared with a remote plasma which contains substantially pure radicals. A direct microwave plasma source does not use a magnetic field and thus does not have a magnetic field-generation device such as a magnetic coil, so that a homogeneous plasma can be formed. In order to generate a direct microwave plasma, typically, an antenna is installed above a susceptor and faces the susceptor within a reaction space. In some embodiments, the antenna is a pole-type antenna, which is installed above the susceptor in parallel to the susceptor. Alternatively, a slot antenna can be used, which generates a surface wave plasma, which slot antenna is installed above the susceptor in parallel to the susceptor. The pole-type antenna includes a quartz tube (functioning as a microwave window) inside which a line-type microwave antenna is accommodated along the axis of the quartz tube, and both ends of which are equipped with magnetrons. In some embodiments, when generating a direct microwave plasma, no bias voltage is applied to a susceptor, i.e., no RF power is supplied to the susceptor. When applying a bias voltage to the susceptor while generating a direct microwave plasma under a low pressure such as 200 Pa or lower, ion energy becomes too high, causing damage to a film on a substrate or etching the film surface.

In some embodiments, in order to generate a homogeneous or uniform plasma in the reaction space, the antenna is provided away from the susceptor at a distance of 5 cm to 10 cm between the antenna and the susceptor. In some embodiments, by rotating the susceptor continuously or intermittently (e.g., rotating the susceptor by 90° once or multiple times), a homogeneous or uniform plasma can be formed in the reaction space.

In some embodiments, microwave power of emitting the microwaves is 500 W to 10,000 W (preferably, 1,000 W to 3,000 W). The above indicated power is for a 300-mm wafer and can be converted to W/cm$^2$ (wattage per unit area of a wafer) as 0.71 W/cm$^2$ to 14.15 W/cm$^2$ (preferably 1.41 W/cm$^2$ to 4.24 W/cm$^2$) which can apply to a wafer having a different diameter such as 200 mm or 450 mm.

In some embodiments, in step (ii) (supplying a reforming gas), only the reforming gas is supplied to the reaction space, where no precursor nor reactant gas is supplied to the reaction space. In the reforming step, no film is deposited on the substrate, i.e., the thickness of the target silicon oxide film is not increased; however, in some embodiments, the thickness of the silicon oxide film may be decreased (e.g., by approximately 3 nm) due to the etching effect of excited reforming gas (generating, e.g., a hydrogen plasma). Typically, the thickness of the silicon oxide film does not change substantially during the reforming step, particularly, when a He plasma is used for reforming the silicon oxide film, no substantial change in the film thickness is observed.

In some embodiments, the reforming gas contains 0.1% to 99.9% by volume of He, preferably 50% or more. Further, the reforming gas contains preferably 90% or more by volume of He; more preferably, 99% or more by volume of He. In some embodiments, the reforming gas consists of He. By irradiating He with microwaves at a low pressure, a He plasma can be generated, which is highly effective in reforming the silicon oxide film including a portion of the film deposited on the sidewalls of a recess pattern, thereby realizing the silicon oxide film having substantially uniform or homogeneous quality regardless of geographical locations of the deposited film in the recess pattern. By using microwaves (having an ultra-high frequency of typically 800 MH or higher), the plasma density can be increased (for example, the plasma density of a microwave (2.45 GHz) plasma is at least one to two digits higher than that of an RF (13.56 MHz) plasma, and electron temperature of the microwave plasma is a half or less of that of the RF plasma), and when He is used, excited He particles do not lose much energy when colliding with each other because collision areas of He particles are small, and thus, excited He particles can maintain their high energy and can effectively reform the surface of silicon oxide film by desorbing and releasing hydrogen from the silicon oxide film, thereby improving (i.e., lowing) the WERR of the silicon oxide film including that of a portion of the film deposited on the sidewalls of the recess pattern.

If an RF plasma is used for reforming silicon oxide film, significant reforming effect cannot be obtained. This is because the RF plasma has a plasma density which is one or two digits smaller than that of a microwave plasma, and thus, a sufficient amount of active species for reforming the film cannot be generated by RF power. Further, the RF plasma has high ion energy, and the film structure may be damaged by high-degree ion bombardment, and thus, RF power cannot be increased to increase the plasma density.

In some embodiments, the reforming gas is a mixture of He and $H_2$, and in some embodiments, the reforming gas contains less $H_2$ than He by volume. In some embodiments, a ratio of $H_2$/He by volume is 1/1000 to 999/1000, preferably 5/100 to 95/100. $H_2$ can be effective as a reforming gas since a $H_2$ plasma has effect similar to that of a He plasma described above. Thus, in some embodiments, the reforming gas consists of $H_2$. As described above, He and $H_2$ can be mixed since even when He and H$_2$ particles collide with each other, the collision areas thereof are significantly small, as compared with, e.g., collision between oxygen particles and He particles, and thus, loss of energy of the particles can be suppressed.

The reforming gas is composed primarily of He and/or H$_2$, but it can contain a small amount of other additive gas such as oxygen. When oxygen gas is contained by, e.g., 50% by volume in the reforming gas, by collision of particles in a plasma, the energy of the particles is significantly reduced (even when the remaining 50% by volume is He), and no significant effect by reformation can be observed. However, when oxygen, for example, is contained by approximately 0.1% by volume, for example, in the reforming gas, a high degree of reforming effect can be obtained.

In some embodiments, step (iii) is conducted at a temperature of 20° C. to 400° C., preferably 140° C. to 260° C. In general, when performing annealing at a high temperature such as 600° C., a silicon oxide film can be reformed. However, when a silicon oxide film is exposed to a microwave plasma, without annealing, good reforming effect of the silicon oxide film can be obtained.

In some embodiments, the silicon oxide film has a thickness of 3 nm or more, and step (iii) (irradiating the reforming gas with microwaves) continues until the silicon oxide film is reformed from its surface to a depth of 3 nm or more. In step (iii), reforming the silicon oxide is conducted by desorbing and releasing hydrogen from the silicon oxide film, and the content of hydrogen at a portion of the silicon oxide film is indicative of accomplishment of reformation of the portion, i.e., by analyzing the content of hydrogen in a thickness direction, it can be determined to what depth the film is reformed. In some embodiments, when the silicon oxide film is reformed from its surface to a depth of 3 nm or more, the reforming effect is considered to be sufficient to improve the film quality such as having high resistance to chemicals (which can be evaluated by WERR). When the silicon oxide film has a thickness of 10 nm or more and if it is desired to reform the film from its surface to a depth of 10 nm or more, the reforming step may be repeated after every 10 nm of accumulated deposition of the film, for example. However, since a direct microwave plasma can penetrate the film from its surface to a depth of more than 10 nm, e.g., approximately 40 nm, by manipulating process parameters including the reforming step duration, pressure, temperature, and microwave power, the film can be reformed in its entirety without repeating the deposition step and reforming step.

In some embodiments, step (i) (providing a substrate with a silicon oxide film) comprises depositing the silicon oxide film on the substrate by plasma-enhanced ALD (PEALD) in a PEALD apparatus, and then transferring the substrate to the reaction space in a microwave plasma apparatus without exposing the substrate to air. Silicon oxide is relatively chemically stable and thus, exposure of the silicon oxide film to air before the reforming step may not cause a problem; however, when the silicon oxide film is very thin, e.g. a thickness is approximately 3 nm, oxidation of an exposed surface of the film may affect the property of a final product or the operation of subsequent processes. In that case, the PEALD apparatus and the microwave plasma apparatus are installed within a same module and connected via a back-end robot. This way the substrate can be transferred from the PEALD apparatus to the microwave plasma apparatus without exposing the substrate to air.

In some embodiments, the silicon oxide film is deposited by PEALD since PEALD is capable of depositing a film with high conformality (e.g., 80% to 100%, preferably 90% or higher, wherein the conformality is defined as a ratio (%) of thickness of film at the center of a sidewall of a trench to thickness of film at the center of a top surface on which the trench is formed) at a relatively low temperature (e.g., 400° C. or lower). However, other processes such as thermal ALD or LPCVD can be used to deposit a silicon oxide film by using a relatively high temperature (e.g., 600° C. or higher).

The embodiments will be explained with respect to the drawings. However, the present invention is not limited to the drawings.

Figure 2:
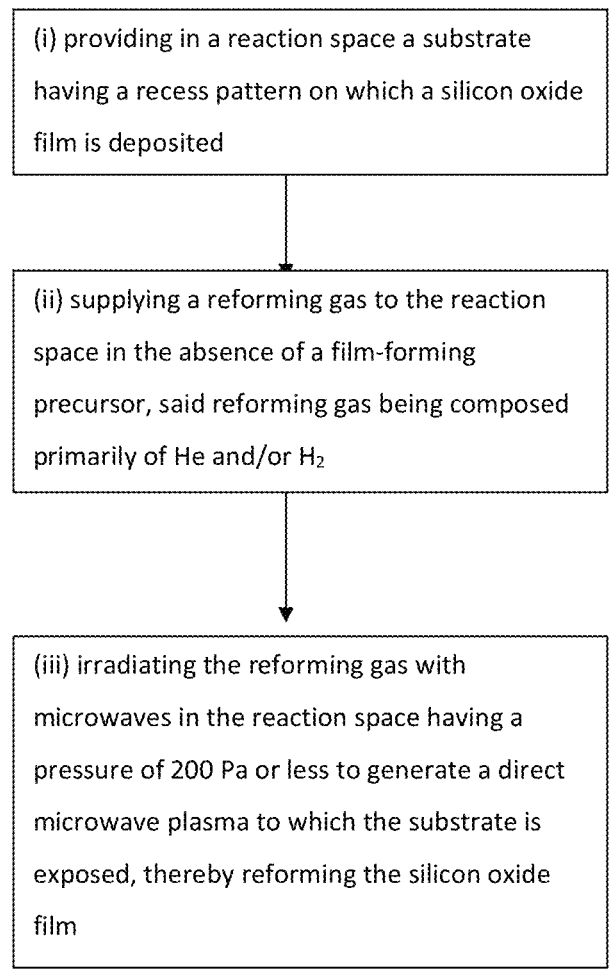
FIG. 2 shows a flow chart showing steps of reforming silicon oxide film according to an embodiment of the present invention.

FIG. 2 shows a flow chart showing steps of reforming silicon oxide film according to an embodiment of the present invention. In step (i), a substrate having a recess pattern on which a silicon oxide film is deposited is provided in a reaction space which is typically constituted by the interior of a reaction chamber of a microwave plasma apparatus. Typically, the silicon oxide film is deposited in a PEALD apparatus which is preferably connected to the microwave plasma apparatus via a back-end robot where both the PEALD apparatus and the microwave plasma apparatus are accommodated in the same module. In step (ii), a reforming gas for reforming the silicon oxide film is supplied to the reaction space in the absence of a film-forming precursor, wherein the reforming gas is composed primarily of He and/or H$_2$. Preferably, the reforming gas is the only gas flowing through the reaction space, and consists essentially of or consists of He and/or H$_2$. When another additive gas such as oxygen gas is added in an amount of 0.5% by volume or more, for example, particles of active species of He and/or H$_2$ reduce their energy by collision with active species of the other additive gas when being exposed to a microwave plasma. In step (iii), the reforming gas is irradiated with microwaves in the reaction space having a pressure of 200 Pa or less to generate a direct microwave plasma to which the substrate is exposed, thereby reforming the silicon oxide film. The direct microwave plasma excites the reforming gas to a high degree since the plasma density of direct microwave plasma is very high as compared with RF plasma (conductively coupled plasma). By performing the above steps, the silicon oxide film can effectively be reformed even at sidewalls of trenches. As a result, the silicon oxide film having topologically or geographically uniform or homogeneous quality can be formed, which is useful in semiconductor fabrication processes including a process for forming 3D V-NAND flash memories which require forming a silicon oxide film in trenches or holes having a high aspect ratio.

In some embodiments, step (iii) may be conducted under the conditions shown in Table 1 below.

TABLE 1

(numbers are approximate)
Conditions for Step (iii)

| | |
|---|---|
| Pressure | 0.1 to 200 Pa (preferably 1 to 30 Pa) |
| Substrate temperature | −20 to 400° C. (preferably 50 to 250° C.) |
| Reforming gas | He, H$_2$, He + H$_2$ (preferably He) |
| Flow rate of reforming gas (continuous) | 1 to 1000 sccm (preferably 10 to 100 sccm) |
| Frequency of microwaves | 0.9 to 10 GHz (preferably 0.9 to 5.8 GHz) |
| Microwave power for a 300-mm wafer | 500 to 10,000 W (preferably 1,000 to 3,000 W) |
| Distance between antenna and susceptor (a thickness of a substrate is about 0.7 mm) | 50 to 300 mm (preferably 50 to 100 mm) |
| Duration of reformation step | 0.1 to 30 min. (preferably 3 to 10 min.) |

The above indicated microwave power for a 300-mm wafer can be converted to W/cm² (wattage per unit area of a wafer) which can apply to a wafer having a different diameter such as 200 mm or 450 mm. The substrate temperature can be considered to be a temperature of the reaction space during the film reformation.

Figure 18:
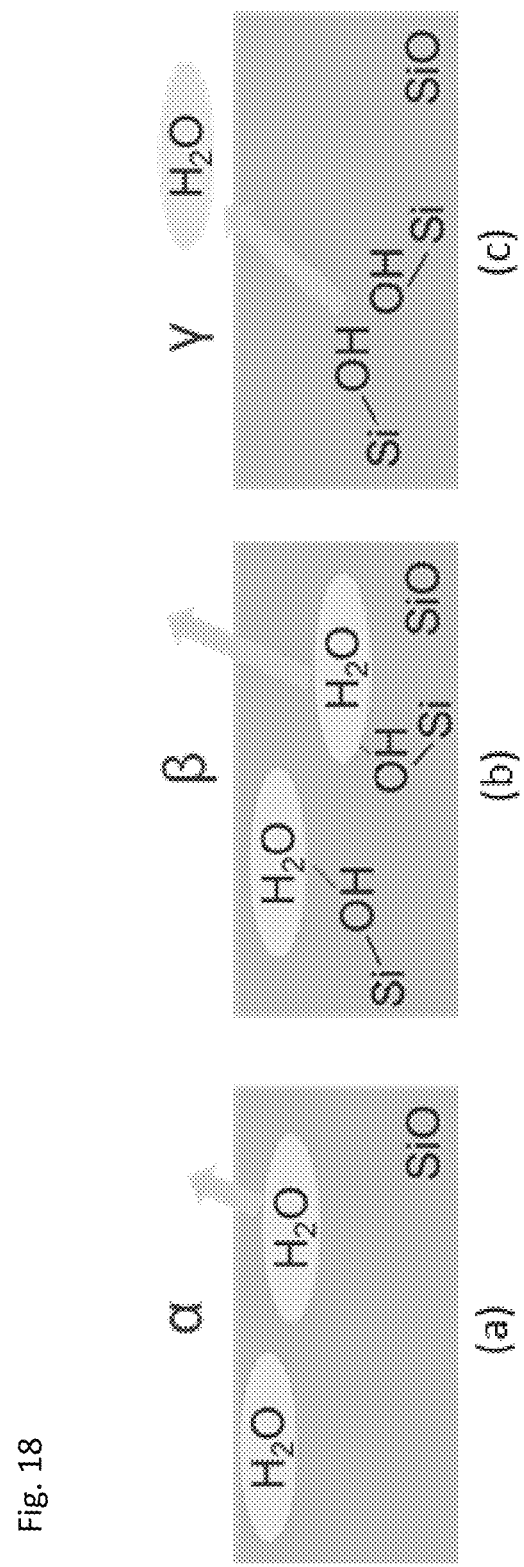
FIG. 18 is schematic drawings illustrating release of $H_2O$ molecules adsorbed on a film ((a) "α"); release of $H_2O$ molecules bonded to a matrix of a film via hydrogen bonding ((b) "β"); and release of $H_2O$ molecules produced by condensation reaction occurring in a film ((c) "γ").

Although the theory does not limit the present invention, the film-reformation typically involves desorption of hydrogen from the silicon oxide film. By removing hydrogen, the film quality such as WERR can significantly be improved. Removal of hydrogen from the silicon oxide film can be measured and confirmed using TDS (Thermal Desorption Spectroscopy). In TDS, the temperature of the film is gradually increased from room temperature to about 1,000° C., and $H_2O$ separating from the film is detected using a quadrupole mass spectrometer (QMS). In TDS, three spectrum peaks of desorbed $H_2O$ are observed: "α"; "β"; and "γ" in principle (e.g., (b) in FIG. 14). FIG. 18 is schematic drawings illustrating release of $H_2O$ molecules adsorbed on a film ((a) "α"); release of $H_2O$ molecules bonded to a matrix of a film via hydrogen bonding ((b) "β"); and release of $H_2O$ molecules produced by condensation reaction occurring in a film ((c) "γ"). The peak of α represents released $H_2O$ molecules at a low temperature which were adsorbed as $H_2O$ molecules in the film; the peak of β represents released $H_2O$ molecules which were trapped in the film via hydrogen bonds; and the peak of γ represents released $H_2O$ molecules which are released as a result of condensation reaction of —OH in the film. From a reformed silicon oxide film which is reformed by a direct microwave plasma according to some embodiments, release of $H_2O$ molecules is significantly lower than that from a non-reformed silicon oxide film, i.e., the peak of β and particularly the peak of γ are low, because through the film-reforming process according to some embodiments, hydrogen molecules have been desorbed and dissociated from the film. It should be noted that no peak of α is typically observed as shown in (a) in FIG. 14 where He microwave plasma is used at a low pressure, whereas a high peak of α is rather exceptionally observed in (b) in FIG. 14 where $H_2$ microwave plasma is used at a low pressure.

The film-reforming process can be performed using any suitable microwave plasma apparatus including an apparatus illustrated in FIG. 1, for example. FIG. 1 is a schematic representation of a microwave plasma apparatus for reforming a silicon oxide film usable in an embodiment of the present invention. In this figure, the apparatus comprises a reaction chamber 5 and a plasma-generating chamber 3 disposed on the reaction chamber 5 wherein the interiors of both are communicated with each other. In the reaction chamber 5 which is evacuatable, a susceptor 2 is provided, which is capable of moving vertically to load and unload a wafer 1 by using lift pins 15 and a robot arm (not shown). When the susceptor 2 is at an upper position where the wafer 1 is processed, an interior 11 of the reaction chamber 5, which is a reaction space, is separated from a loading/unloading section 16 by an isolation ring 14. The reaction space 11 can be evacuated using an annular exhaust duct 13, and a reforming gas or other gas is supplied to the reaction space 11 from the plasma-generating chamber 3. The plasma-generating chamber 3 constitutes a plasma-generating section 17 right above the reaction space 11. In the plasma-generating chamber 3, a pole-type microwave antenna 4 is disposed facing the wafer 1 and in parallel to the susceptor 2, so that microwaves are uniformly transmitted toward the wafer 1 while the reforming gas is fed to the plasma-generating chamber 3 (along arrows 21). The pole-type microwave antenna 4 is provided with and connected to magnetrons (not shown) attached typically at the ends of the antenna to feed microwaves into the antenna.

In some embodiments, the pole-type microwave antenna is enclosed in a quartz or ceramic tube which functions as a microwave window, wherein a plasma grows from both ends and extends along the tube, thereby forming an axially homogeneous microwave plasma. Multiple pole-type microwave antennas (e.g., 2, 4, or 8) can be installed in parallel to each other to form a two dimensional plasma array for forming a uniform plasma with reference to a surface of the wafer 1. Since a microwave plasma is a direct microwave plasma, no magnetic coil is used (i.e., no magnetic field formed to generate a plasma). Further, no bias voltage is supplied to the susceptor 2 so as to prevent ion energy from becoming too high and causing damage to the film or etching the film. Alternatively, a slot antenna (a plate-type antenna with multiple slots) can be used, which generates a surface wave plasma, wherein a shower plate for feeding a reforming gas to the reaction space is installed above the slot antenna at a short distance (upstream of the slot antenna). Any other microwave antennas, including conventional antennas, suitable for generating a direct microwave plasma can be used. The direct microwave plasma which contains both radicals and ions is different from a remote plasma which contains primarily radicals and substantially no ions.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

The present invention is further explained with reference to working examples below. However, the examples are not intended to limit the present invention. In the examples where conditions and/or structures are not specified, the skilled artisan in the art can readily provide such conditions and/or structures, in view of the present disclosure, as a matter of routine experimentation. Also, the numbers applied in the specific examples can be modified by a range of at least ±50% in some embodiments, and the numbers are approximate.

EXAMPLES

Example 1

A substrate (having a diameter of 300 mm and a thickness of 0.7 mm) on which a silicon oxide film (a blanket film) having a thickness of 30 nm was deposited by PEALD was prepared. The substrate was loaded to the microwave apparatus illustrated in FIG. 1 and processed therein to reform the silicon oxide film using a sequence illustrated in FIG. 2 under conditions shown in Table 2 below. Helium gas was used as a reforming gas. Multiple films deposited on the substrates, respectively, were reformed for different reforming durations (1, 3, and 10 minutes) and then subjected to wet etching treatment under conditions shown in Table 3 below using an etching duration as a variable. Etched amounts of the silicon oxide films were measured to determine the film quality of each film.

TABLE 2

(numbers are approximate)
Conditions for Reforming Step

| | |
|---|---|
| Pressure | 30 Pa |
| Substrate temperature | Room temperature |
| Reforming gas | He |
| Flow rate of reforming gas (continuous) | 100 sccm |
| Frequency of microwaves | 2.45 GHz |
| Microwave power for a 300-mm wafer | 1,000 W |
| Distance between antenna and susceptor | 100 mm |
| Duration of reformation step | 0, 1, 3, and 10 min. |

TABLE 3

(numbers are approximate)
Conditions for wet etching

| | |
|---|---|
| Etching solution | 1:100 diluted HF (hydrofluoric acid); normally 0.5 to 2% HF |
| Temperature | 17° C.; normally room temperature (20° C.) ± 5° C. |
| Sample size | 5 × 5 cm; not limited |
| Etching time | Variable or constant; see the corresponding FIGURE |

As an etching solution, CxFy dry etching or the like can be used in place of DHF.

Figure 3:
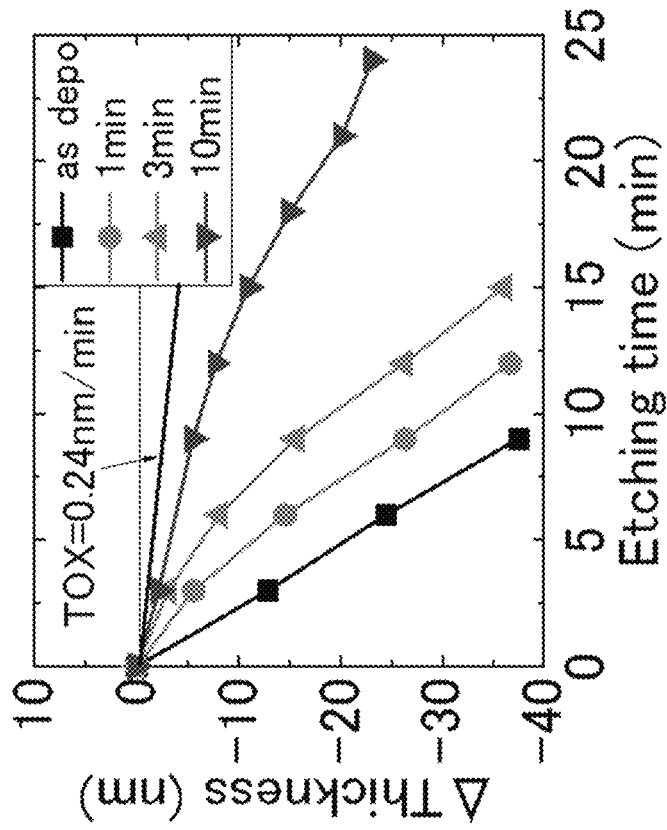
FIG. 3 is a graph showing etched quantity (Δthickness) of silicon oxide film in relation to etching duration of the film before and after post-deposition reforming treatment using a He microwave plasma at room temperature when varying the duration of reforming treatment according to embodiments of the present invention.

The results are shown in FIG. 3. FIG. 3 is a graph showing etched quantity (Δthickness) of silicon oxide film in relation to etching duration of the film before and after post-deposition reforming treatment using a He microwave plasma at room temperature when varying the duration of reforming treatment. The graph of FIG. 3 also shows etched quantity (Δthickness=0.24 nm/min.) of thermal oxide film in relation to etching duration of the film as a reference etched quantity. As shown in FIG. 3, the longer the reforming duration the less the etched quantity of the film per unit time became, i.e., the more the film reformation was manifested. Further, since the etching rate of the non-reformed film, that of the film reformed for 1 minute, and that of the film reformed for 3 minutes were approximately the same after the etched thickness reached approximately 10 nm, it can be understood that by reforming the film at room temperature using a He microwave plasma for about 3 minutes, the film can be reformed from the surface to a depth of approximately 10 nm. Furthermore, since the etching rate of the film reformed for 10 minutes was continuously lower than that of the non-reformed film even after the etched thickness reached approximately 10 nm, it can be understood that by reforming the film at room temperature using a He microwave plasma for about 10 minutes, surprisingly, the film can be reformed from the surface to a depth of more than approximately 10 nm, over approximately 20 nm, and expectedly as deep as approximately 30 nm in view of FIG. 12 for microwave plasma exposure at a pressure of 30 Pa described later.

Example 2

Silicon oxide films deposited on substrates, respectively, were reformed and wet-etched in a manner substantially identical to that in Example 1, except that the film-reforming step was conducted at 200° C.

Figure 4:
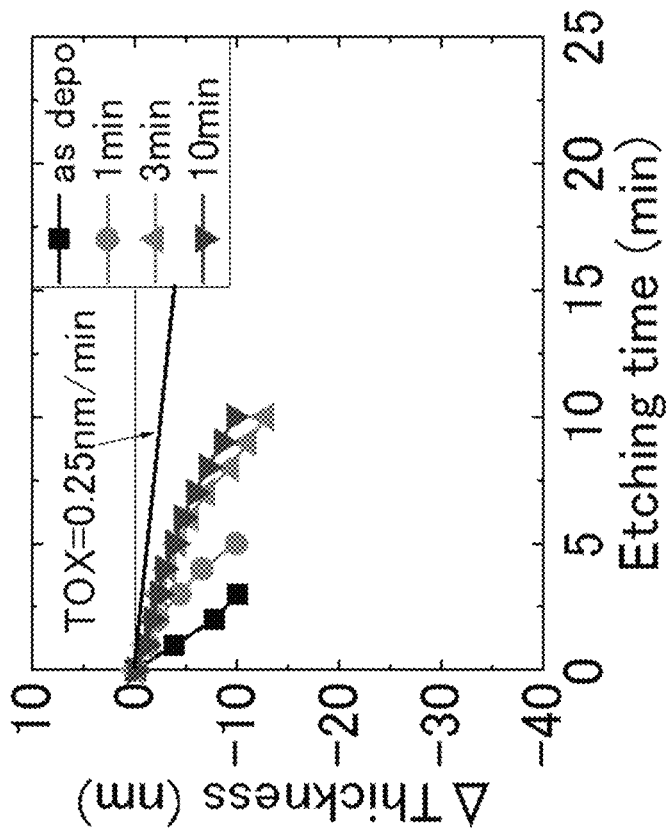
FIG. 4 is a graph showing etched quantity (Δthickness) of silicon oxide film in relation to etching duration of the film before and after post-deposition reforming treatment using a He microwave plasma at 200° C. when varying the duration of reforming treatment according to embodiments of the present invention.

The results are shown in FIG. 4. FIG. 4 is a graph showing etched quantity (Δthickness) of silicon oxide film in relation to etching duration of the film before and after post-deposition reforming treatment using a He microwave plasma at 200° C. when varying the duration of reforming treatment. The graph of FIG. 4 also shows etched quantity (Δthickness=0.25 nm/min.) of thermal oxide film in relation to etching duration of the film as a reference etched quantity. As is shown in FIG. 4, as in FIG. 3, generally, the longer the reforming duration the less the etched quantity of the film per unit time became, i.e., the more the film reformation was manifested. Particularly, the etched quantity per unit time of the film reformed at 200° C. for 1 minute and that of the film reformed at 200° C. for 3 minutes (FIG. 4) were less than those of the films reformed at room temperature for 1 minute and 3 minutes, respectively (FIG. 3). However, the etched quantity per unit time of the film reformed at 200° C. for 10 minutes (FIG. 4) was slightly more than that of the film reformed at room temperature for 10 minutes (FIG. 3). Accordingly, it can be understood that by reforming the film at a temperature higher than room temperature using a He microwave plasma, the film can be reformed to a higher degree if the reforming temperature is not too high or the reforming duration is not too long. Preferably, when the reforming temperature is 50° C. to 250° C. and the reforming duration is 1 to 10 minutes (the upper and lower limits are inclusive or exclusive depending on the embodiment), desired reforming effect can be obtained.

Example 3

Silicon oxide films deposited on substrates, respectively, were reformed and wet-etched in a manner substantially identical to that in Example 2, except that film-reforming effect was determined as WERR (wet etch rate relative to that of thermal oxide film) when the etched quantity of each film was less than approximately 3 nm.

Figure 6:
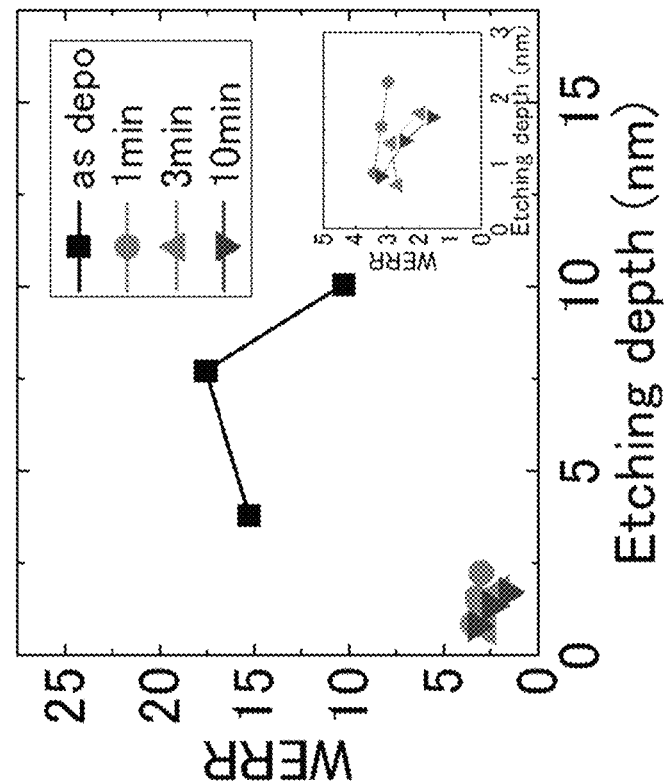
FIG. 6 is a graph showing wet etch relative rate (WERR) of silicon oxide film in relation to etched depth of the film before and after post-deposition reforming treatment using a He microwave plasma when varying the duration of reforming treatment according to embodiments of the present invention.

The results are shown in FIG. 6. FIG. 6 is a graph showing wet etch relative rate (WERR) of silicon oxide film in relation to etched depth of the film before and after post-deposition reforming treatment using a He microwave plasma when varying the duration of reforming treatment. As shown in FIG. 6, the film reforming was manifested from the surface to a depth of approximately 3 nm, and the WERR was as low as 2 to 4 when the reforming duration was 1 to 10 minutes, particularly as low as approximately 2 when the reforming duration was 3 to 10 minutes.

Comparative Example 1

Silicon oxide films deposited on substrates, respectively, were reformed and wet-etched in a manner substantially identical to that in Example 3, except that as a reforming gas, oxygen gas was used in place of He gas (i.e., using an oxygen microwave plasma), and film-reforming effect was determined as WERR when the etched quantity of each film was less than approximately 10 nm.

Figure 5:
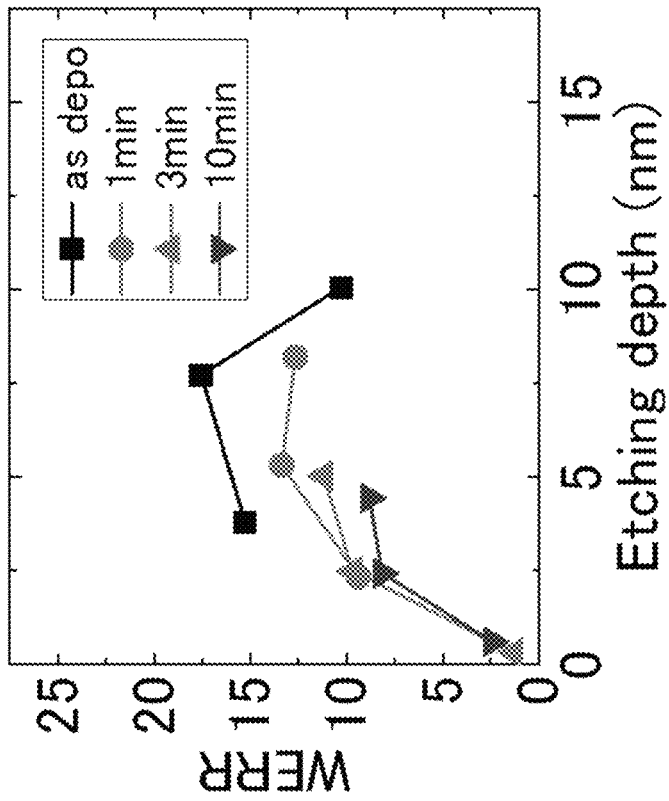
FIG. 5 is a graph showing wet etch relative rate (WERR) of silicon oxide film in relation to etched depth of the film before and after post-deposition reforming treatment using an $O_2$ microwave plasma when varying the duration of reforming treatment according to comparative examples.

The results are shown in FIG. 5. FIG. 5 is a graph showing wet etch relative rate (WERR) of silicon oxide film in relation to etched depth of the film before and after post-deposition reforming treatment using an $O_2$ microwave plasma when varying the duration of reforming treatment. As shown in FIG. 5, film-reforming effect using an oxygen microwave plasma was manifested only to a degree which was much lower than that observed when using a He microwave plasma shown in FIG. 6, and the WERR was as high as approximately 10 at a depth of approximately 3 nm regardless of the reforming duration.

Example 4

Silicon oxide films deposited on substrates, respectively, were reformed in a manner substantially identical to that in Example 1 under conditions shown in Table 4 below. The films were reformed under different pressures (30, 100, and 200 Pa) and then subjected to wet etching treatment under conditions shown in Table 3 using an etched quantity ("Etched depth") as a variable. The WERR of each silicon oxide film was measured to determine the film quality of the film.

TABLE 4

(numbers are approximate)
Conditions for Reforming Step

| | |
|---|---|
| Pressure | 30, 100, 200 Pa |
| Substrate temperature | 200° C. |
| Reforming gas | He |
| Flow rate of reforming gas (continuous) | 100 sccm |
| Frequency of microwaves | 2.45 GHz |
| Microwave power for a 300-mm wafer | 1,000 W |
| Distance between antenna and susceptor | 100 mm |
| Duration of reformation step | 1 min. |

Figure 7:
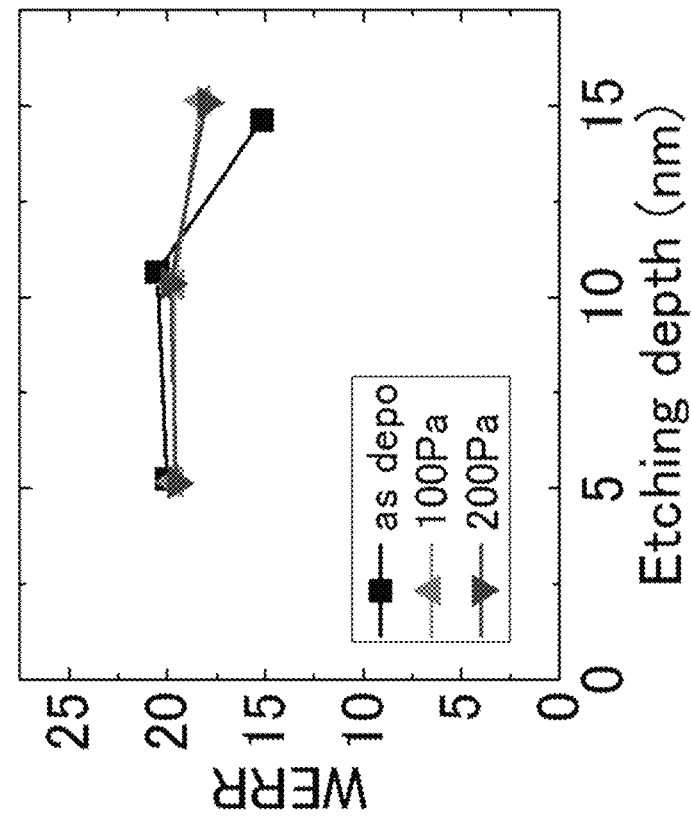
FIG. 7 is a graph showing wet etch relative rate (WERR) of silicon oxide film in relation to etched depth of the film before and after post-deposition reforming treatment using a He microwave plasma when varying the pressure of reforming treatment according to embodiments of the present invention.

The results are shown in FIG. 7. FIG. 7 is a graph showing wet etch relative rate (WERR) of silicon oxide film in relation to etched depth of the film before and after post-deposition reforming treatment using a He microwave plasma when varying the pressure of reforming treatment. As shown in FIG. 7, film-reforming effect was manifested from the surface to a depth of approximately 10 nm of the films under a pressure of 200 Pa or less. Particularly when the pressure was 30 Pa, film-reforming effect was remarkable from the surface to a depth of approximately 3 nm. Accordingly, it can be understood that by reforming the film under a low pressure using a He microwave plasma, the film can be reformed from the surface to a depth of approximately 10 nm for 1 minute. Preferably, when the reforming pressure is 0.1 to 200 Pa, more preferably 1 to 30 Pa, (the upper and lower limits are inclusive or exclusive depending on the embodiment), desired reforming effect can be obtained.

Comparative Example 2

Silicon oxide films were reformed and wet-etched in a manner substantially identical to that in Example 4, except that a He RF plasma (conductively coupled plasma using a radio frequency of 13.56 MHz), and the reforming duration was 5 minutes.

Figure 8:
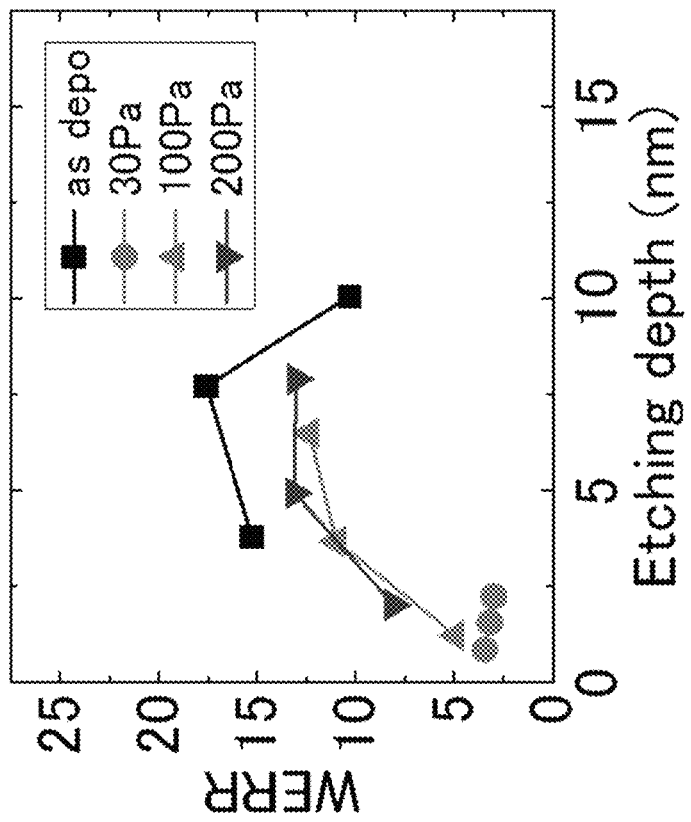
FIG. 8 is a graph showing wet etch relative rate (WERR) of silicon oxide film in relation to etched depth of the film before and after post-deposition reforming treatment using a He RF plasma when varying the pressure of reforming treatment according to comparative examples.

The results are shown in FIG. 8. FIG. 8 is a graph showing wet etch relative rate (WERR) of silicon oxide film in relation to etched depth of the film before and after post-deposition reforming treatment using a He RF plasma when varying the pressure of reforming treatment. As shown in FIG. 8, no film-reforming effect using a He RF plasma was manifested, and the WERR was not different from that of the film without performing the reforming step.

Example 5

A substrate (having a diameter of 300 mm and a thickness of 0.7 mm) having trenches with a width of approximately 36 nm and a depth of approximately 300 nm (an aspect ratio of 8), on which a silicon oxide film having an average thickness of 14 nm was deposited by PEALD, was prepared. Silicon oxide films deposited on the substrates, respectively, were reformed in a manner substantially identical to that in Example 1 under conditions shown in Table 5 below. The films were reformed under different pressures (20, 30, 50, and 100 Pa) and then subjected to wet etching treatment under conditions shown in Table 3 using an etching time ("dHF time") as a variable. The thickness of each silicon oxide film was measured to determine the film quality of the film.

TABLE 5

(numbers are approximate)
Conditions for Reforming Step

| | |
|---|---|
| Pressure | 20, 30, 50, 100 Pa |
| Substrate temperature | 200° C. |
| Reforming gas | He |
| Flow rate of reforming gas (continuous) | 100 sccm |
| Frequency of microwaves | 2.45 GHz |
| Microwave power for a 300-mm wafer | 1,000 W |
| Distance between antenna and susceptor | 100 mm |
| Duration of reformation step | 10 min. |

Figure 9:
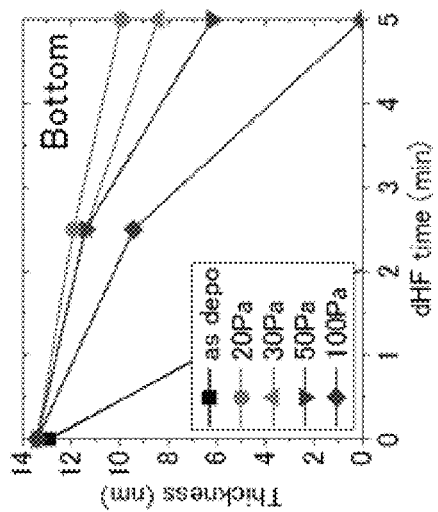
FIG. 9 is a graph showing etched quantity (thickness) of silicon oxide film deposited on a sidewall of a trench in relation to wet etching duration of the film before and after post-deposition reforming treatment when varying the pressure of reforming treatment according to embodiments of the present invention.
Figure 10:
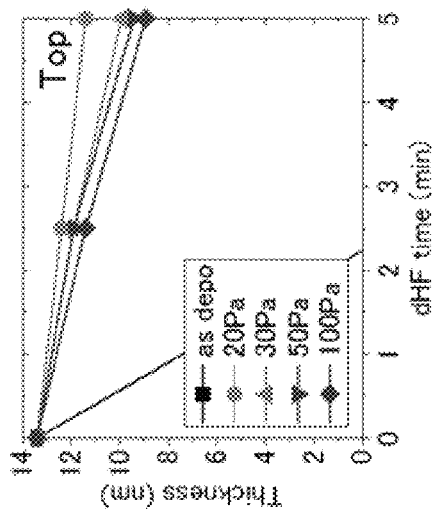
FIG. 10 is a graph showing etched quantity (thickness) of silicon oxide film deposited on a top surface in which a trench is formed in relation to wet etching duration of the film before and after post-deposition reforming treatment when varying the pressure of reforming treatment according to embodiments of the present invention.
Figure 11:
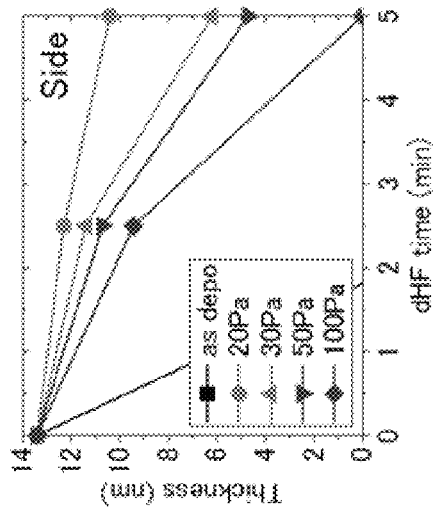
FIG. 11 is a graph showing etched quantity (thickness) of silicon oxide film deposited on a bottom of a trench in relation to wet etching duration of the film before and after post-deposition reforming treatment when varying the pressure of reforming treatment according to embodiments of the present invention.

The results are shown in FIGS. 9 to 11. FIG. 9 is a graph showing etched quantity (thickness) of silicon oxide film deposited on a sidewall of a trench in relation to wet etching duration of the film before and after post-deposition reforming treatment when varying the pressure of reforming treatment. FIG. 10 is a graph showing etched quantity (thickness) of silicon oxide film deposited on a top surface in which a trench is formed in relation to wet etching duration of the film before and after post-deposition reforming treatment when varying the pressure of reforming treatment. FIG. 11 is a graph showing etched quantity (thickness) of silicon oxide film deposited on a bottom of a trench in relation to wet etching duration of the film before and after post-deposition reforming treatment when varying the pressure of reforming treatment.

As shown in FIGS. 9 to 11, film-reforming effect was manifested not only on the top surface in which the trenches were formed, but also at the bottom and even at the sidewalls of the trenches substantially in their entirety under all pressures of 20, 30, 50, and 100 Pa by reforming the film for 10 minutes. Further, it was observed that the lower the pressure the higher the film-reforming effect became, and surprisingly, when the pressure was 20 Pa, wet etching resistance of the film deposited on the sidewalls of the trenches was as good as that of the film deposited on the top surface and the bottom of the trenches, which resistance was manifested in its entirety, especially from the surface of the film to a depth of approximately 5 nm. Further, when the pressure was 50 Pa or less, wet etching resistance of the film deposited on the bottom of the trenches and also that of the film deposited on the sidewalls were as good as that of the film deposited on the top surface and the bottom of the trenches, which resistance was manifested in its entirety, especially from the surface of the film to a depth of approximately 3 nm. Accordingly, by reforming a silicon oxide film using a direct microwave plasma, the silicon oxide film can be so reformed as to make the film geographically or topologically uniform and homogeneous even in trenches having a high aspect ratio. Preferably when the reforming pressure is 1 to 50 Pa, more preferably 1 to 30 Pa, (the upper and lower limits are inclusive or exclusive depending on the embodiment), desired reforming effect can be obtained, thereby providing a silicon oxide film having geographically or topologically uniform and homogeneous quality.

Example 6

Silicon oxide films (a blanket film) having a thickness of approximately 35 nm deposited on substrates, respectively, were reformed and wet-etched in a manner substantially identical to that in Example 5, except that the substrates did not have trenches, the pressure was 20 or 30 Pa, and the microwave power was 2,000 W. According to the non-limiting theory, the film-reforming effect is attributed to a reduction of hydrogen from the film as described in this disclosure, and the mechanism of a reduction of hydrogen from the film is illustrated in FIG. 18. In this example, the hydrogen content of the film was measured before and after the film-reforming step.

Figure 12:
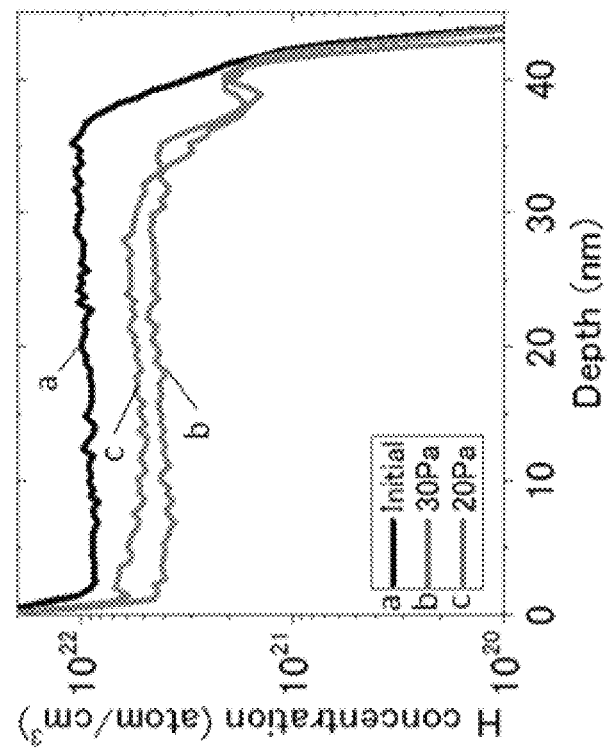
FIG. 12 is a chart of Secondary Ion Mass Spectrometry (SIMS) of silicon oxide film before and after post-deposition reforming treatment using a He microwave plasma when varying the pressure of reforming treatment according to embodiments of the present invention.

The results are shown in FIG. 12. FIG. 12 is a chart of Secondary Ion Mass Spectrometry (SIMS) of silicon oxide film before and after post-deposition reforming treatment using a He microwave plasma when varying the pressure of reforming treatment. As shown in FIG. 12, consistent with FIG. 3 for microwave plasma exposure for 10 minutes, a layer of the film from the surface to a depth of approximately 30 nm was reformed under a pressure of 30 Pa in view of the hydrogen content of the film. When the pressure was 20 Pa, surprisingly, the film (with a thickness of approximately 35 nm) was more reformed throughout the entire film than when the pressure was 30 Pa, and it is expected that a He microwave plasma can reform a silicon oxide film from its surface to a depth of over 40 nm under a pressure of 20 Pa for 10 minutes of exposure to the He microwave plasma.

It should be noted that although a layer from the surface to a depth of approximately 3 nm in this figure, particularly at the surface, shows high hydrogen content, as it is commonly known in the art, that is because the surface of the film is exposed to air for analysis and also because SIMS analysis uses ion bombardment, which etches the film in a depth direction, for analysis, and while doing so, hydrogen atoms present in the etched portion of the film are struck and some of them are driven into a portion under the etched portion in the depth direction. Thus, the hydrogen content from the surface to a depth of approximately 3 nm does not accurately represent the actual hydrogen content and should not be considered.

Figure 14:
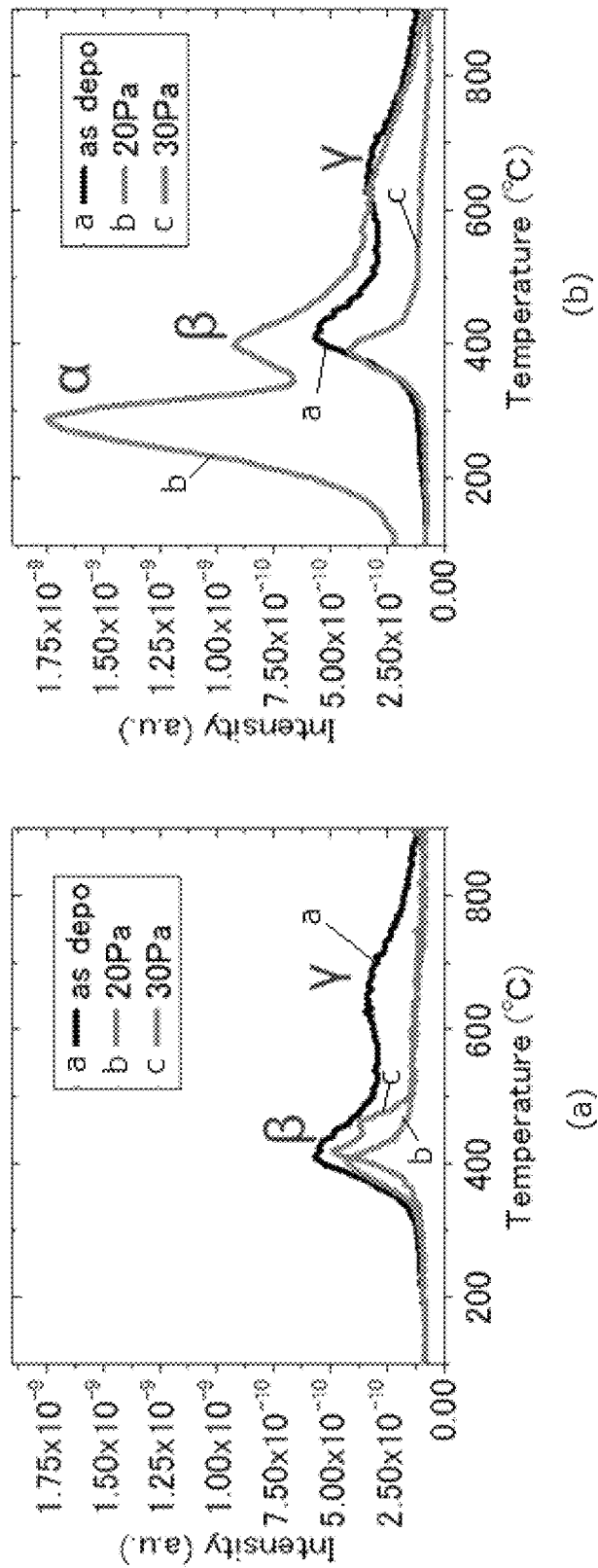
FIG. 14 shows charts of Thermal Desorption Spectroscopy (TDS) of silicon oxide film before and after post-deposition reforming treatment using (a) He microwave plasma and (b) $H_2$ microwave plasma when varying the pressure of reforming treatment according to embodiments of the present invention.

(a) in FIG. 14 is a chart of Thermal Desorption Spectroscopy (TDS) of the above-discussed silicon oxide films. In this TDS, two spectrum peaks of desorbed $H_2O$ are observed as "β" and "γ". Also as illustrated in FIG. 18, the peak of "β" indicates release of $H_2O$ molecules at a temperature of approximately 450° C., which molecules were bonded to a matrix of the film via hydrogen bonding; and the peak of "γ" indicates release of $H_2O$ molecules at a temperature of approximately 650° C., which molecules were produced by condensation reaction occurring in the film. That is, the peak of β represents released $H_2O$ molecules which were trapped in the film via hydrogen bonds; and the peak of γ represents released $H_2O$ molecules which were released as a result of condensation reaction of —OH in the film. From the reformed silicon oxide films ("30 Pa" and "20 Pa") which were reformed by He direct microwave plasma under pressures of 30 Pa and 20 Pa, respectively, release of $H_2O$ molecules was significantly lower than that from the non-reformed silicon oxide film ("as depo"), i.e., the peak of β and particularly the peak of γ were low, because through the film-reforming process using He direct microwave plasma, hydrogen molecules were desorbed and dissociated from the film. When the pressure was 20 Pa, particularly, the peak of β was lower than that when the pressure was 30 Pa, indicating that more film reformation occurred at a pressure of 20 Pa than at a pressure of 30 Pa.

(b) in FIG. 14 is a chart of Thermal Desorption Spectroscopy (TDS) of silicon oxide films which were obtained in a manner substantially similar to that described above, except that $H_2$ was used in place of He. When using $H_2$ direct microwave plasma at a pressure of 30 Pa, characteristics similar to those observed when using He direct microwave plasma at a pressure of 30 Pa ((a) in FIG. 14) were observed as shown in (b) in FIG. 14. However, when using $H_2$ direct microwave plasma at a pressure of 20 Pa, different characteristics from those observed when using He direct microwave plasma at a pressure of 20 Pa ((a) in FIG. 14) were observed as shown in (b) in FIG. 14, wherein an exceptionally high peak of α (indicating disruption or dissociation of hydrogen molecules adsorbed on the film) and a high peak of β (indicating disruption or dissociation of hydrogen molecules bonded to a matrix of the film via hydrogen bonding) were observed. These peaks appeared to be contributed to moisture adsorbed while the substrate was stored and exposed to the atmosphere. High energy H ions are known to be capable of breaking Si—O—Si bonds, forming Si—OH, and as a result, the film was likely to have become more apt to absorb moisture therein (the lower the pressure, the longer the mean free path of ions becomes, thereby increasing the energy generated by accelerated ions, and accordingly, at a low pressure such as 20 Pa, energy sufficient for forming Si—OH can be generated). In contrast, when using He direct microwave plasma, the peak of β (indicating disruption or dissociation of Si—OH from the film) was lowered, i.e., an increase of Si—OH as a result of breaking Si—O—Si bonds did not occur at a low pressure. Based on the above, it can be stated that He direct microwave plasma is a highly suitable treatment, particularly, for treating SiO film as a post-deposition low-pressure treatment, as compared with $H_2$ direct microwave plasma, since He direct microwave plasma can be conducted under conditions having wider ranges of process parameters at a lower pressure.

Example 7

Silicon oxide films deposited on substrates, respectively, were reformed and wet-etched in a manner substantially identical to that in Example 6, except that as a reforming gas, $H_2$ gas was used in place of He gas (i.e., using a hydrogen microwave plasma).

Figure 13:
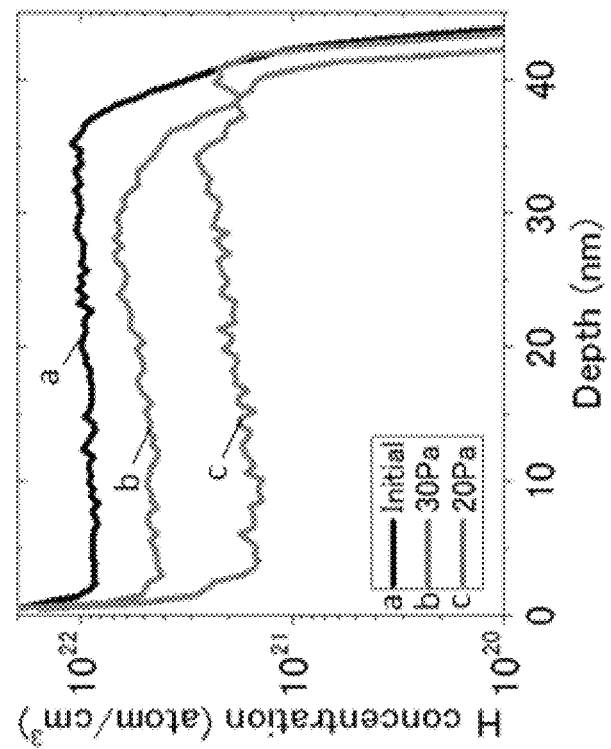
FIG. 13 is a chart of Secondary Ion Mass Spectrometry (SIMS) of silicon oxide film before and after post-deposition reforming treatment using a $H_2$ microwave plasma when varying the pressure of reforming treatment according to embodiments of the present invention.

The results are shown in FIG. 13. FIG. 13 is a chart of Secondary Ion Mass Spectrometry (SIMS) of silicon oxide film before and after post-deposition reforming treatment using a $H_2$ microwave plasma when varying the pressure of reforming treatment. As shown in FIG. 13, film-reforming effect using a hydrogen microwave plasma was manifested similarly to that shown in FIG. 12 but to a degree which was slightly lower than that observed when using a He microwave plasma shown in FIG. 12. Also, in FIG. 13, there is no significant difference in hydrogen content between a pressure of 30 Pa and a pressure of 20 Pa. The above may be because when using a hydrogen microwave plasma, some hydrogen atoms remain inside the film, and a reduction of hydrogen content reaches a plateau after reaching a certain level of reduction.

Example 8

A substrate (having a diameter of 300 mm and a thickness of 0.7 mm) having trenches with a width (top opening) of approximately 100 nm and a depth of approximately 250 nm (an aspect ratio of 2.5) was provided, on which a silicon oxide film having a conformality of approximately 100% with a thickness (on the top surface of the substrate) of 13 nm was deposited by PEALD under conditions shown in Table 7 below on a silicon nitride film which had been deposited by PEALD under conditions shown in Table 6 below.

TABLE 6

(numbers are approximate)
Conditions for depositing SiN film

| | |
|---|---|
| Precursor Si$_2$H$_6$ feed (sccm) | 11 |
| Reactant H$_2$ feed (slm) | 0.7 |
| Reactant N$_2$ feed (slm) | 0.4 |
| Dilution Ar feed (slm) | 2.5 |
| Carrier Ar feed (slm) | 4.5 |
| Sealing Ar feed (slm) | 0.2 |
| Pressure (Pa) | 300 |
| RF (13.56 MHz) (W) | 35 |
| Susceptor temperature (° C.) | 340 |
| Shower head temperature (° C.) | 130 |
| Chamber wall temperature (° C.) | 100 |
| Electrode gap (mm) | 13 |
| Feed time (sec.) | 0.2 |
| Purge time (once) (sec.) | 2.0 |
| Cycle number | 220 |

TABLE 7

(numbers are approximate)
Conditions for depositing poor quality SiO film

| | |
|---|---|
| Precursor | BDEAS |
| Reactant O$_2$ feed (slm) | 1.1 |
| Carrier Ar feed (slm) | 0.9 |
| Sealing N$_2$ feed (slm) | 0.1 |
| Pressure (Pa) | 400 |
| RF (13.56 MHz) (W) | 50 |
| Bottle temperature (° C.) | 50 |
| Susceptor temperature (° C.) | 260 |
| Shower head temperature (° C.) | 170 |
| Chamber wall temperature (° C.) | 150 |
| Electrode gap (mm) | 12 |
| Feed time (sec.) | 0.8 |
| Purge time (1$^{st}$) (sec.) | 2.0 |
| RF-ON time (sec.) | 1.2 |
| Purge time (2$^{nd}$) (sec.) | 0.1 |
| Cycle number | 170 |

In the above, BDEAS is bisdiethylaminosilane.

In this example, the silicon oxide film was deposited at a relatively low temperature and at relatively low RF power so that the silicon oxide film was expected to be easily etched in order to determine film-reforming effect on low quality silicon oxide film deposited in a substrate with trenches.

Figure 15:
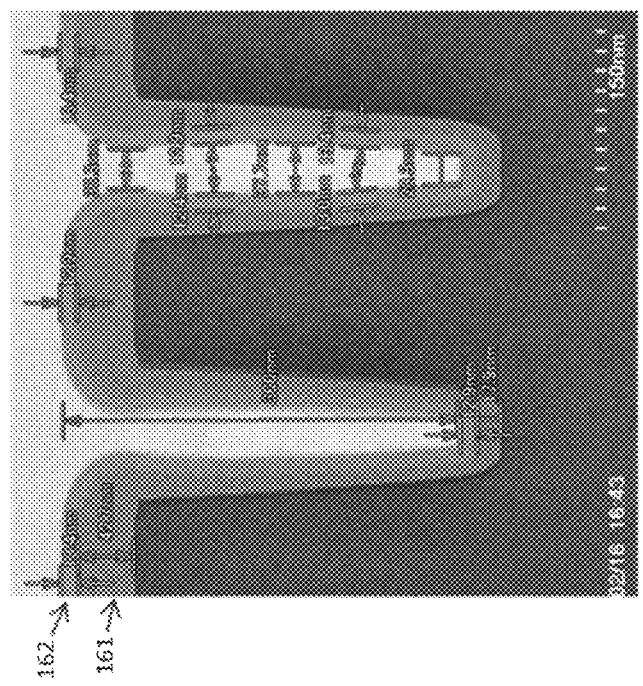
FIG. 15 is a STEM photograph showing a cross-sectional view of trenches wherein a silicon oxide film was deposited on a silicon nitride film prior to film-reforming treatment.

FIG. 15 is a STEM photograph showing a cross sectional view of the trenches wherein the silicon oxide film was deposited on the silicon nitride film prior to film-reforming treatment. As shown in FIG. 15, the silicon oxide film 162 was deposited on the silicon nitride film 161 covering the trenches, wherein the thickness of the silicon oxide film 162 was 12.9 to 13.46 nm at the center on the top surfaces, 13.0 to 13.4 nm at a lower part of the sidewalls of the trenches, and 12.9 nm at the bottoms of the trenches, and the top opening (width) was 30.3 nm.

The silicon oxide films deposited on the substrates, respectively, were reformed in a manner substantially identical to that in Example 5 under conditions shown in Table 8 below, and then wet-etched in a manner substantially identical to that in Example 5 except that the etching duration was 10 minutes.

TABLE 8

(numbers are approximate)
Conditions for Reforming Step

| | |
|---|---|
| Pressure | 20 Pa |
| Substrate temperature | 200° C. |
| Reforming gas | He, H$_2$ |
| Flow rate of reforming gas (continuous) | 100 sccm |
| Frequency of microwaves | 2.45 GHz |
| Microwave power for a 300-mm wafer | 2,000 W |
| Distance between antenna and susceptor | 100 mm |
| Duration of reformation step | 10 min. |

Figure 16:
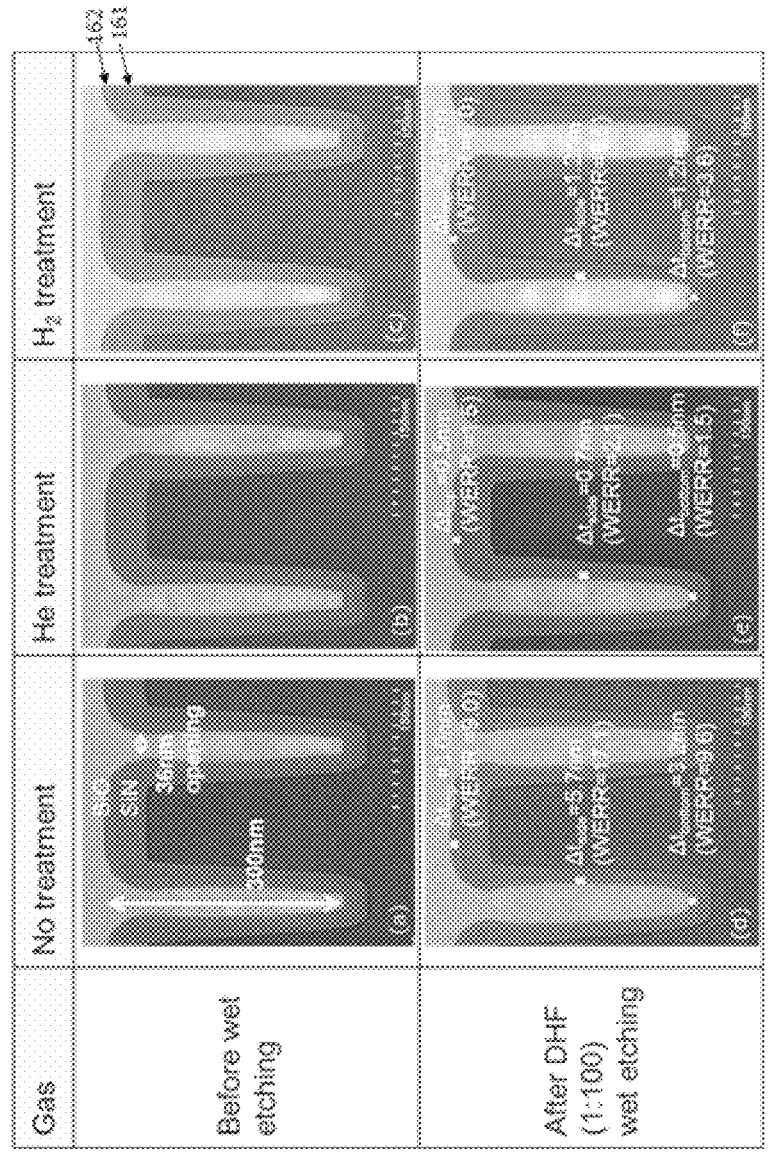
FIG. 16 shows STEM photographs of cross-sectional views of trenches wherein a silicon oxide film deposited therein (shown in (a)), without microwave plasma treatment, was subjected to wet etching (shown in (b) "No treatment"); the silicon oxide film was reformed by He microwave plasma treatment at room temperature, and then subjected to wet etching (shown in (c) "He treatment"); and the silicon oxide film was reformed by $H_2$ microwave plasma treatment at room temperature, and then subjected to wet etching (shown in (c) "$H_2$ treatment") according to embodiments of the present invention.

FIG. 16 shows STEM photographs of cross sectional views of the trenches wherein the silicon oxide film was deposited therein (shown in (a)); the silicon oxide film was reformed by microwave He plasma treatment at 200° (shown in (b)); alternatively, the silicon oxide film was reformed by microwave H$_2$ plasma treatment at 200° C. (shown in (c)); the silicon oxide film without microwave plasma treatment was subjected to wet etching (shown in (d)); the silicon oxide film reformed by microwave He plasma treatment at 200° was subjected to wet etching (shown in (e)); and alternatively, the silicon oxide film reformed by microwave H$_2$ plasma treatment at 200° C. was subjected to wet etching (shown in (f)). As shown in (d) in FIG. 16, the non-reformed silicon oxide film 162 was etched by approximately 3.0 nm (WERR=9.0) on the top surface, by approximately 5.7 nm (WERR=17.1) at the middle part of the sidewalls of the trenches, and by approximately 3.2 nm (WERR=9.6) at the bottom of the trenches. Since the silicon oxide film 162 was made low in quality, the etched quantity of the film was high regardless of the locations of the film in the trenches, although the film deposited on the sidewall was etched significantly more than the film deposited at the bottom of the trench which was etched slightly more than the film deposited on the top surface.

However, as shown in (e) in FIG. 16, after reforming the silicon oxide film 162 by He direct microwave plasma, even though the film had poor quality, the reformed silicon oxide film 162 was etched only by approximately 0.5 nm (WERR=1.5) on the top surface, by approximately 0.7 nm (WERR=2.1) at the middle part of the sidewall, and by approximately 0.5 nm (WERR=1.5) at the bottom of the trenches, indicating that He direct microwave plasma can effectively and substantially reform a poor quality silicon oxide film even at the sidewalls where conventional post-deposition treatment using oxygen RF plasma could not effectively reform. Similarly, as shown in (f) in FIG. 16, after reforming the silicon oxide film 162 by H$_2$ direct microwave plasma, the reformed silicon oxide film 162 was etched only by approximately 2.0 nm (WERR=6.0) on the top surface, by approximately 1.2 nm (WERR=3.6) at the middle part of the sidewall, and by approximately 1.2 nm (WERR=3.6) at the bottom of the trenches, indicating that H$_2$ direct microwave plasma can effectively and substantially reform a poor quality silicon oxide film even at the sidewalls.

Example 9

A silicon oxide film deposited on a substrate was reformed and wet-etched in a manner substantially identical to that in Example 8, except that the silicon oxide film was deposited under conditions shown in Table 9 below so that the silicon oxide film had good quality as compared with that in Example 8.

TABLE 9

(numbers are approximate)
Conditions for depositing high quality SiO film

| Precursor | BDEAS |
|---|---|
| Reactant $O_2$ feed (slm) | 1.1 |
| Carrier Ar feed (slm) | 0.9 |
| Sealing $N_2$ feed (slm) | 0.1 |
| Pressure (Pa) | 400 |
| RF (13.56 MHz) (W) | 500 |
| Bottle temperature (° C.) | 50 |
| Susceptor temperature (° C.) | 390 |
| Shower head temperature (° C.) | 170 |
| Chamber wall temperature (° C.) | 150 |
| Electrode gap (mm) | 12 |
| Feed time (sec.) | 0.8 |
| Purge time ($1^{st}$) (sec.) | 2.0 |
| RF-ON time (sec.) | 1.2 |
| Purge time ($2^{nd}$) (sec.) | 0.1 |
| Cycle number | 170 |

STEM photographs of cross sectional views of the trenches were obtained (not shown) wherein the silicon oxide film was deposited on the silicon nitride film as deposited prior to wet etching; the silicon oxide film, without microwave plasma treatment, was subjected to wet etching; and the silicon oxide film was reformed by microwave plasma treatment, and then subjected to wet etching. According to the STEM photographs, the silicon oxide film (prior to wet etching) was deposited on the silicon nitride film covering the trenches, wherein the thickness of the silicon oxide film 162 was 7.2 nm at the center on the top surface, 6.9 nm at the center of the sidewall of the trench (a conformality (side/top) of approximately 96%), and 6.7 nm at the bottom of the trench (a conformality (bottom/top) of approximately 93%). When the silicon oxide film was subjected to wet etching without microwave plasma treatment, the non-reformed silicon oxide film was etched by approximately 2.2 nm on the top surface, by approximately 6.9 nm at the center of the sidewall of the trench, and by approximately 2.5 nm at the bottom of the trench. Since the silicon oxide film was made high in quality, the etched quantity of the film was low on the top surface and at the bottom of the trench, although the film deposited at the bottom of the trench was etched slightly more than the film deposited on the top surface. However, even though the silicon oxide film had high quality, the film deposited on the sidewall had low quality and substantially all of the sidewall film was etched away.

However, when the silicon oxide film was reformed by microwave plasma treatment and then subjected to wet etching, because of reforming the silicon oxide film by a He direct microwave plasma, the reformed silicon oxide film was etched only by approximately 0.5 nm on the top surface, by approximately 0.5 nm at the bottom of the trench, and surprisingly also only by approximately 0.5 nm at the sidewall of the trench, indicating that He direct microwave plasma can effectively reform a high quality silicon oxide film even having poor quality sidewall film, so that the reformed silicon oxide film can have geographically or topologically uniform or homogeneous quality regardless of quality.

Example 10

Silicon oxide films deposited on substrates were reformed and wet-etched, respectively, in a manner substantially identical to that in Example 9 except that the silicon oxide films were reformed in a manner shown in Table 10 below. That is, the respective films were reformed under different pressures (20, 30, 50, and 100 Pa) at 200° C., and different substrate temperatures (room temperature, 100, 200, and 300° C.) under a pressure of 20 Pa, by applying a microwave power of 2,000 W for 5 minutes) as a variable. The WERR of each silicon oxide film was measured to determine the film quality of the film. The wet etching conditions were the same as those in Example 1.

TABLE 10

(numbers are approximate)
Conditions for Reforming Step

| Pressure | 20, 30, 50, 100 Pa (varying at 200° C.) |
|---|---|
| Substrate temperature | RT, 100, 200, 300° C. (varying at 20 Pa) |
| Reforming gas | He, $H_2$ |
| Flow rate of reforming gas (continuous) | 100 sccm |
| Frequency of microwaves | 2.45 GHz |
| Microwave power for a 300-mm wafer | 2,000 W |
| Distance between antenna and susceptor | 100 mm |
| Duration of reformation step | 5 min. |

Figure 17:
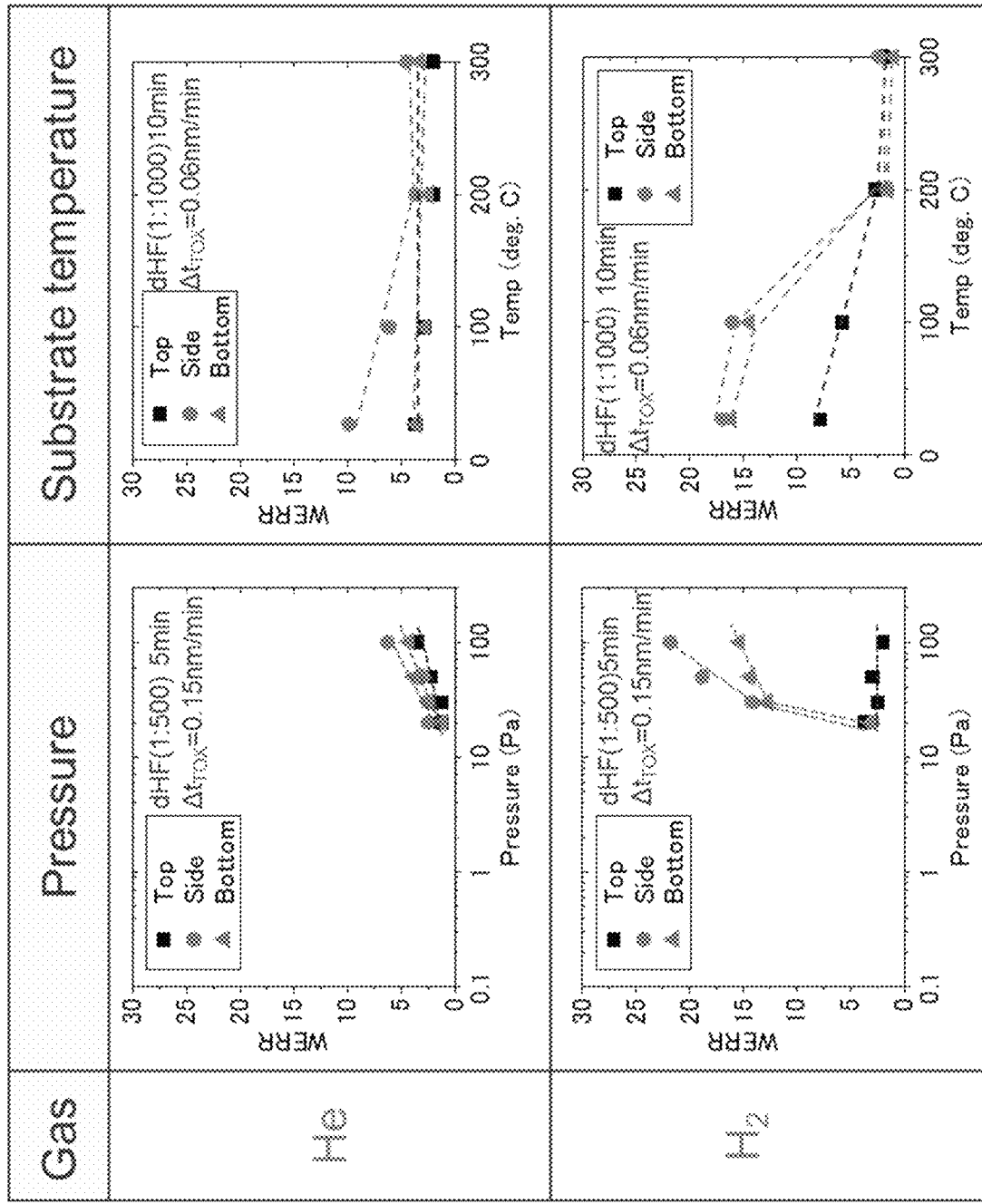
FIG. 17 are graphs showing wet etch relative rate (WERR) of silicon oxide film when varying the pressure and substrate temperature of reforming treatment using a He microwave plasma and $H_2$ microwave plasma according to embodiments of the present invention.

The results are shown in FIG. 17. FIG. 17 is a graph showing wet etch relative rate (WERR) of each silicon oxide film in relation to etched depth of the film before and after post-deposition reforming treatment using a He or $H_2$ microwave plasma when varying the pressure of reforming treatment. As shown in FIG. 17, film-reforming effect was manifested under a pressure of 100 Pa or less for He microwave plasma at all locations, i.e., the top surface and the sidewalls and bottom of the trench, and under a pressure of 100 Pa or less for $H_2$ microwave plasma at the sidewalls and bottom of the trench, but not at the top surface. Particularly when the pressure was 20 Pa, film-reforming effect was remarkable. Accordingly, it can be understood that by reforming the film under a low pressure using a He microwave plasma, the film can be reformed from the surface to a depth of approximately 10 nm in 5 minutes. Also, it can be understood that by reforming the film under a low pressure using a $H_2$ microwave plasma, the film can be reformed particularly at the sidewalls and bottom of the trench (e.g., to a depth of approximately 10 nm) in 5 minutes so that the top surface and the sidewalls and bottom of the trench can substantially evenly be etched. Preferably, when the reforming pressure is 0.1 to 200 Pa, more preferably 1 to 30 Pa, (the upper and lower limits are inclusive or exclusive depending on the embodiment), desired reforming effect can be obtained. Further, as shown in FIG. 17, film-reforming effect was manifested at a temperature of 200° C. or higher for He microwave plasma and $H_2$ microwave plasma. Preferably, when the reforming substrate temperature is 100 to 300° C., more preferably 200 to 300° C. (the upper and lower limits are inclusive or exclusive depending on the embodiment), desired reforming effect can be obtained.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A method of post-deposition treatment for silicon oxide film, which is conducted only after stopping all deposition processes of the silicon oxide film and comprises:
   (i) providing in a reaction space a substrate on which the silicon oxide film is deposited;

(ii) supplying a reforming gas for reforming the silicon oxide film to the reaction space through a showerhead in the absence of a film-forming precursor, said reforming gas being composed primarily of He and/or $H_2$, and supplying a sealing gas without passing through the showerhead; and (iii) irradiating the reforming gas with microwaves for 1 to 10 minutes in the reaction space having a temperature of 300° C. or lower to generate a direct microwave plasma to which the substrate is exposed, thereby reforming the silicon oxide film in depth within a range from its surface to 5 nm, wherein the microwaves have a frequency of 800 MHz or higher, wherein the substrate is placed on a susceptor, wherein the microwaves are emitted from an antenna provided above the susceptor, and wherein the reforming gas is supplied within the reaction chamber upstream of the antenna.

2. The method according to claim 1, wherein the substrate comprises a recess having a top surface, a sidewall, and a bottom, on which the silicon oxide film is deposited so as to form a top layer on the top surface, a side layer on the sidewall, and a bottom layer on the bottom, wherein in step (iii), the top layer, the side layer, and the bottom layer are exposed to the direct microwave, thereby reducing a wet etch relative rate of each of the top layer, the side layer, and the bottom layer, wherein a reduction of the wet etch relative rate of each of the side layer and the bottom layer is greater than that of the top layer.

3. The method according to claim 1, wherein in step (ii), only the reforming gas is supplied to the reaction space.

4. The method according to claim 1, wherein the sealing gas comprises a noble gas or nitrogen.

5. The method according to claim 1, wherein the reforming gas consists of He.

6. The method according to claim 1, wherein the reforming gas consists of $H_2$.

7. The method according to claim 1, wherein the reforming gas contains 99% or more He by volume.

8. The method according to claim 1, wherein the microwaves have a frequency of 800 MHz to 10 GHz.

9. The method according to claim 1, wherein microwave power of emitting the microwaves is 500 W to 10,000 W.

10. The method according to claim 1, wherein the antenna is provided at a distance of 5 cm to 10 cm away from the susceptor.

11. The method according to claim 1, wherein the antenna comprises an even number of pole-type antennae installed parallel to each other.

12. The method according to claim 11, wherein the antennae are configured to form a two dimensional plasma array.

13. The method according to claim 1, wherein no RF power is supplied to the susceptor in step (iii).

14. The method according to claim 1, wherein step (iii) is conducted at a temperature of 20° C. to 300° C.

15. The method according to claim 1, wherein no bias voltage is applied to the susceptor during step (iii).

16. The method according to claim 1, wherein in step (i), the silicon oxide film on the substrate provided in the reaction space is a silicon oxide film deposited by plasma-enhanced ALD (PEALD) in a PEALD apparatus, and then transferred to the reaction space in a microwave plasma apparatus without exposing the substrate to air.

17. The method according to claim 1, wherein steps (i) to (iii) are continuously repeated until a desired thickness of the reformed silicon oxide film is obtained.

18. The method according to claim 1, wherein during step (ii) the susceptor is rotated intermittently.

19. The method according to claim 1, wherein the reaction space has a pressure of 200 Pa or less during step (iii).

20. The method according to claim 1, wherein step (iii) continues until hydrogen is desorbed and released from the silicon oxide film.

* * * * *